United States Patent
Cannavo

(10) Patent No.: US 11,415,069 B2
(45) Date of Patent: Aug. 16, 2022

(54) METHOD FOR CONTROLLING A DC-TO-DC VOLTAGE CONVERTER

(71) Applicant: VITESCO TECHNOLOGIES GmbH, Hanover (DE)

(72) Inventor: Jean Cannavo, Toulouse (FR)

(73) Assignee: VITESCO TECHNOLOGIES GMBH, Hannover (DE)

( * ) Notice: Subject to any disclaimer, the term of this patent is extended or adjusted under 35 U.S.C. 154(b) by 45 days.

(21) Appl. No.: 17/258,118

(22) PCT Filed: Jul. 8, 2019

(86) PCT No.: PCT/EP2019/068281
§ 371 (c)(1),
(2) Date: Jan. 5, 2021

(87) PCT Pub. No.: WO2020/011720
PCT Pub. Date: Jan. 16, 2020

(65) Prior Publication Data
US 2021/0277844 A1      Sep. 9, 2021

(30) Foreign Application Priority Data

Jul. 10, 2018   (FR) ...................................... 1856316

(51) Int. Cl.
*F02D 41/20*      (2006.01)
(52) U.S. Cl.
CPC ...... *F02D 41/20* (2013.01); *F02D 2041/2006* (2013.01); *F02D 2041/2068* (2013.01)
(58) Field of Classification Search
CPC ............ F02D 41/20; F02D 2041/2006; F02D 2041/2068
See application file for complete search history.

(56) References Cited

U.S. PATENT DOCUMENTS 4,809,122 A * 2/1989 Fitzner ................. H02H 7/0811
                                                            318/434
2012/0049822 A1   3/2012 Li et al.
(Continued)

FOREIGN PATENT DOCUMENTS

EP           2 366 880        9/2011

OTHER PUBLICATIONS

International Search Report for PCT/EP2019/068281 dated Sep. 26, 2019, 5 pages.
(Continued)

*Primary Examiner* — Hung Q Nguyen
*Assistant Examiner* — Mark L. Greene
(74) *Attorney, Agent, or Firm* — Nixon & Vanderhye

(57) ABSTRACT

Disclosed is a method for controlling a DC-DC voltage converter for driving with current at least one fuel injector of a motor-vehicle internal combustion engine. The method includes, when the transistor is switched from the off state to the on state, triggering a counter for measuring time, and, if at the end of a preset time called the "observation" time, the amplitude of the peak current has not reached its maximum value, steps of commanding that transistor so that the transistor switches from the on state to the off state, of keeping the transistor in the off state for a preset time called the "cooling time", and of commanding the transistor so that the transistor switches to the on state at the end of the cooling time.

20 Claims, 2 Drawing Sheets

(56) References Cited

U.S. PATENT DOCUMENTS

2016/0226239 A1 8/2016 Yang et al.
2017/0335789 A1* 11/2017 Kiuchi .................. F02D 41/062
2018/0034380 A1 2/2018 Chen

OTHER PUBLICATIONS

Written Opinion of the ISA for PCT/EP2019/068281 dated Sep. 26, 2019, 7 pages.

* cited by examiner

METHOD FOR CONTROLLING A DC-TO-DC VOLTAGE CONVERTER

CROSS-REFERENCE TO RELATED APPLICATIONS

This application is the U.S. national phase of International Application No. PCT/EP2019/068281 filed Jul. 8, 2019 which designated the U.S. and claims priority to FR 1856316 filed Jul. 10, 2018, the entire contents of each of which are hereby incorporated by reference.

BACKGROUND OF THE INVENTION

Field of the Invention

The present invention relates to the field of DC-DC voltage converters, and more particularly to a DC-DC voltage converter intended to be located on-board an ICE motor vehicle (ICE standing for Internal Combustion Engine), for example with a view to delivering the energy required to drive fuel injectors.

Description of the Related Art

In ICE motor vehicles, it is known to use a DC-DC voltage converter to deliver the energy required to drive fuel injectors. Such a converter notably allows the voltage delivered by the battery of the vehicle, about 12 V for example, to be converted into a higher target output voltage, 65 V for example, that allows a capacitor, called the "intermediate" capacitor, connected to the output of the converter and that delivers current to a drive module allowing, on command by a computer, the fuel injectors to be driven, to be recharged.

Thus, when the computer commands the drive module, the latter uses the current delivered by the intermediate capacitor to drive the fuel injectors. In so doing, the intermediate capacitor discharges and the converter then activates to recharge it until the output voltage returns to its target value.

The internal operating principle of the converter consists in charging a coil with the current delivered by the battery and in cutting the current cyclically, using a switch, especially a transistor, an MOS transistor for example. When the switch is closed, the coil charges, and when the switch is open, the energy stored in the coil is transmitted in the form of a current to the intermediate capacitor in order to recharge it. The alternation of the closed and open states of the switch thus generates a sawtooth current, called the peak current.

The amplitude of this peak current allows the output voltage to rise at a greater or lesser rate. Thus, when the amplitude of the peak current is high, the output voltage of the converter rises rapidly after a voltage drop and, in contrast, when the amplitude of the peak current is low, the output voltage of the converter rises slowly. In both cases, the converter ceases to produce the peak current when the output voltage reaches its target value.

Furthermore, the lower the input voltage delivered by the supply battery of the vehicle, the more it is necessary to increase the amplitude of the peak current required to get the output voltage of the converter to rise to its target value. In this case, the electronic components of the converter heat up, this possibly leading to substantial losses that may damage the converter. Furthermore, when the input voltage is too low, the peak current does not reach the top value necessary for the output voltage of the converter to rise to its target value, this considerably decreasing the efficiency of the converter.

In order to partially remedy these drawbacks, one known solution consists in using a comparator to compare the value of the input voltage to a preset floor and to stop the command of the transistor when said value drops below said floor. The cutoff floor of the converter is determined by the overheating of the converter at high ambient temperature. Now, the supply voltages demanded, especially in an automotive context, are lower at cold temperatures than at hot ambient temperatures. A supply-voltage floor that is constant as a function of temperature therefore does not allow the converter to be optimally dimensioned. Specifically, a constant floor leads the converter to be over-dimensioned in order to decrease the overheating floor with respect to the supply voltage required at low temperatures, this being a substantial drawback.

Another known solution consists in using a comparator to compare the value of the output voltage to a preset floor and to stop the command of the transistor when said value drops below said floor. A cutoff based on an output-voltage floor may mean the converter stops only after a relatively long time, if the peak current does not reach its top value. In this case, the converter delivers no or very little power for a very long time, i.e. the time taken to discharge the intermediate capacitor added to the cooling time required as a result, this again being a substantial drawback.

There is therefore a need for a simple, rapid, reliable, inexpensive and effective solution for optimizing command of the peak current of the converter.

SUMMARY OF THE INVENTION

To this end, the invention firstly relates to a method for controlling a DC-DC voltage converter for driving with current at least one fuel injector of a motor-vehicle internal combustion engine, said converter comprising a control module and an induction coil that is connected to a field-effect transistor comprising a drain, a source and a gate, said gate being connected to the control module in order for said control module to command the transistor to an on state in which current passes between the drain and the source or to an off state in which current does not pass between the drain and the source, the alternation of the on and off states of the transistor generating a sawtooth current called the peak current, the amplitude of which is bounded by a maximum value, called the "top" value, and that allows the converter to deliver an output voltage across the terminals of a capacitor called the "intermediate" capacitor, the discharge of which is commanded by a computer via a drive module in order to command at least one fuel injector, the converter being configured to make said output voltage tend toward a target value, the method being noteworthy in that it comprises the steps of:

when the transistor is switched from the off state to the on state, triggering a counter for measuring time,
if at the end of a preset time called the "observation" time, the amplitude of the peak current has not reached its maximum value, commanding the transistor so that said transistor switches from the on state to the off state,
keeping the transistor in the off state for a preset time called the "cooling" time,
commanding the transistor so that said transistor switches to the on state at the end of the cooling time.

The method according to the invention thus allows the converter, by observing that the peak current has not rapidly reached its top value, this meaning that the input voltage of the converter is too low, to be stopped for a preset time in order to allow its components to cool and thus losses to be decreased while limiting the decrease in the efficiency thereof. It will be noted that since the converter is rapidly reactivated after each stoppage, this allowing a fraction of the output power to be maintained, while the supply voltage is low. Moreover, at cold temperatures, these stoppages of the converter occur naturally at a lower voltage than at high ambient temperature (decrease in resistance to cold temperatures), this therefore making it possible to continue to operate at lower voltages when it is cold and to more easily meet customer requirements.

Preferably, the preset observation time is comprised between 50 and 100 microseconds.

Advantageously, the preset cooling time is comprised between 0 and 2000 microseconds. This time may especially be zero in the case (time of zero if the observation time is enough to protect the converter)

The invention also relates to a DC-DC voltage converter for driving with current at least one fuel injector of a motor-vehicle internal combustion engine, said converter comprising a control module and an induction coil that is connected to a field-effect transistor comprising a drain, a source and a gate, said gate being connected to the control module in order for said control module to command the transistor to an on state in which current passes between the drain and the source or an off state in which current does not pass between the drain and the source, the alternation of the on and off states of the transistor generating a sawtooth current called the peak current, the amplitude of which is bounded by a maximum value, called the "top" value, and that allows the converter to deliver an output voltage across the terminals of a capacitor called the "intermediate" capacitor, the discharge of which is commanded by a computer via a drive module in order to command at least one fuel injector, the converter being configured to make said output voltage tend toward a target value. The control module is configured to:
- switch the transistor from the off state to the on state,
- trigger a counter for measuring time when the transistor is switched to the on state,
- if at the end of a preset time called the "observation" time, the amplitude of the peak current has not reached its maximum value, command the transistor so that said transistor switches from the on state to the off state,
- keep the transistor in the off state for a preset time called the "cooling" time,
- command the transistor so that said transistor switches to the on state at the end of the cooling time.

Preferably, the control module comprises the counter for measuring the time taken for the peak current to reach or not its top value.

Advantageously, the control module comprises a comparator of the voltage defined across the terminals of a current-measuring shunt connected between the source of the transistor and ground, and of a reference voltage representing the top value of the peak current.

According to one aspect of the invention, the control module comprises an OR logic gate a first input of which is connected to the output of the counter and a second input of which is connected to the output of the comparator.

Advantageously, the control module comprises a logic unit configured to send signals for commanding the gate of the transistor in order to get said transistor to switch to an on state or to an off state.

Also advantageously, the control module comprises a latch, for example an SR-Q latch, that receives, on a first input, the control signals sent by the logic unit in order to switch the transistor to the on state and, on a second input, the output of the logic gate in order to switch the transistor to the off state.

According to one aspect of the invention, the control module comprises a driver that receives, as input, the output of the latch and that delivers, as output, a voltage for commanding the gate of the transistor with a view to switching it to the on or off state.

Lastly, the invention relates to a motor vehicle comprising a converter such as presented above.

BRIEF DESCRIPTION OF THE DRAWINGS

Further features and advantages of the invention will become apparent from the following description, which is provided with reference to the appended figures, which are given by way of nonlimiting examples and in which the same references are given to similar objects.

DESCRIPTION OF THE PREFERRED EMBODIMENTS

Figure 1:
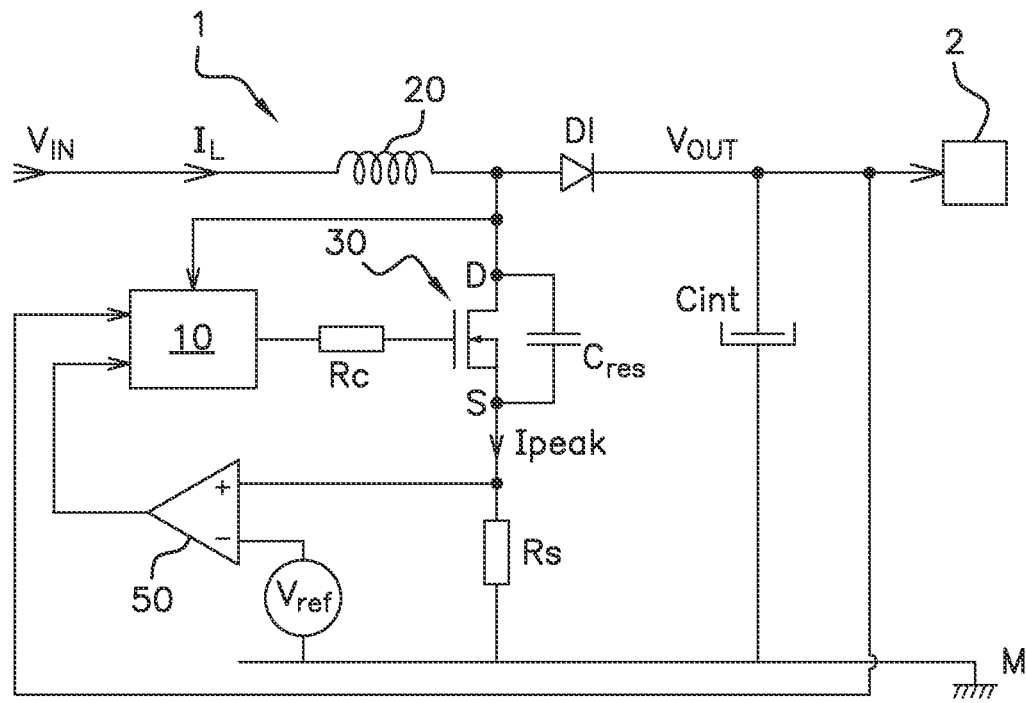
FIG. 1 illustrates one embodiment of the converter according to the invention.

FIG. 1 shows one example of a converter 1 according to the invention. The converter 1 is intended to be installed in a motor vehicle, for example in order to deliver an output voltage Vout allowing fuel injectors 2 to be controlled. The converter 1 is a quasi-resonant DC-DC voltage converter.

In the example described below, but non-limitingly, the converter 1 is a boost converter 1 allowing a capacitor called an "intermediate" capacitor Cint, which supplies the energy required to activate the fuel injectors 2, to be recharged.

The converter 1 transforms an input voltage Vin (input current $I_L$) supplied by the battery of the vehicle into an output voltage Vout applied across the terminals of the intermediate capacitor Cint, the voltages being measured with respect to ground M.

The converter 1 comprises a control module 10, an induction coil 20, a field-effect transistor 30 and a voltage comparator 50.

The induction coil 20 is installed at the input of the circuit so as to be charged when it is passed through by the input current $I_L$.

A diode DI is installed between the induction coil 20 and the high terminal of the intermediate capacitor Cint, which terminal corresponds to the output of the converter 1, i.e. the terminal connected to the injectors 2.

The diode DI lets current pass from the induction coil 20 to the intermediate capacitor Cint but prevents current from flowing from the intermediate capacitor Cint to the induction coil 20 in order to prevent the intermediate capacitor Cint from discharging into the converter 1.

The transistor 30 comprises a drain D, a source S and a gate G, said gate G being connected to the control module 10 in order for said control module 10 to command the transistor 30 to an on state in which current passes between the drain D and the source S or to an off state in which current does not pass between the drain D and the source S. The source S is connected to ground M via a shunt resistor Rs.

The gate G is connected to the control module 10 via a control resistor Rc. In this nonlimiting example, a capacitor Cres is connected in parallel with the transistor 30, between the drain D and the source S, in order to make the converter 1 quasi-resonant.

The alternation of the on and off states of the transistor 30 generates a sawtooth current called the peak current Ipeak, the amplitude of which is bounded by a maximum value, and that allows the converter 1 to deliver the output voltage Vout, which is defined across the terminals of the capacitor Cint, which is called the "intermediate" capacitor, the discharge of this capacitor being commanded by a computer (not shown and known per se) via a drive module (not shown and known per se) in order to command the fuel injectors 2. The converter 1 is configured to make the output voltage Vout tend to a target value, 65 V for example.

The control module 10 is configured to switch the transistor 30 from the off state to the on state and to count the time passed since said switch. If at the end of a preset time called the "observation" time, the amplitude of the peak current Ipeak has not reached its maximum value, the control module 10 is configured to command the transistor 30 so that said transistor 30 switches from the on state to the off state. Preferably, but nonlimitingly, the preset observation time is comprised between 50 and 100 microseconds.

The control module 10 is also configured to keep the transistor 30 in the off state for a preset time called the "cooling" time and to command the transistor 30 so that said transistor 30 switches to the on state at the end of the cooling time. Preferably, but nonlimitingly, the preset cooling time is comprised between 0 and 2000 microseconds (time of zero if the observation time is enough to protect the converter).

Figure 2:
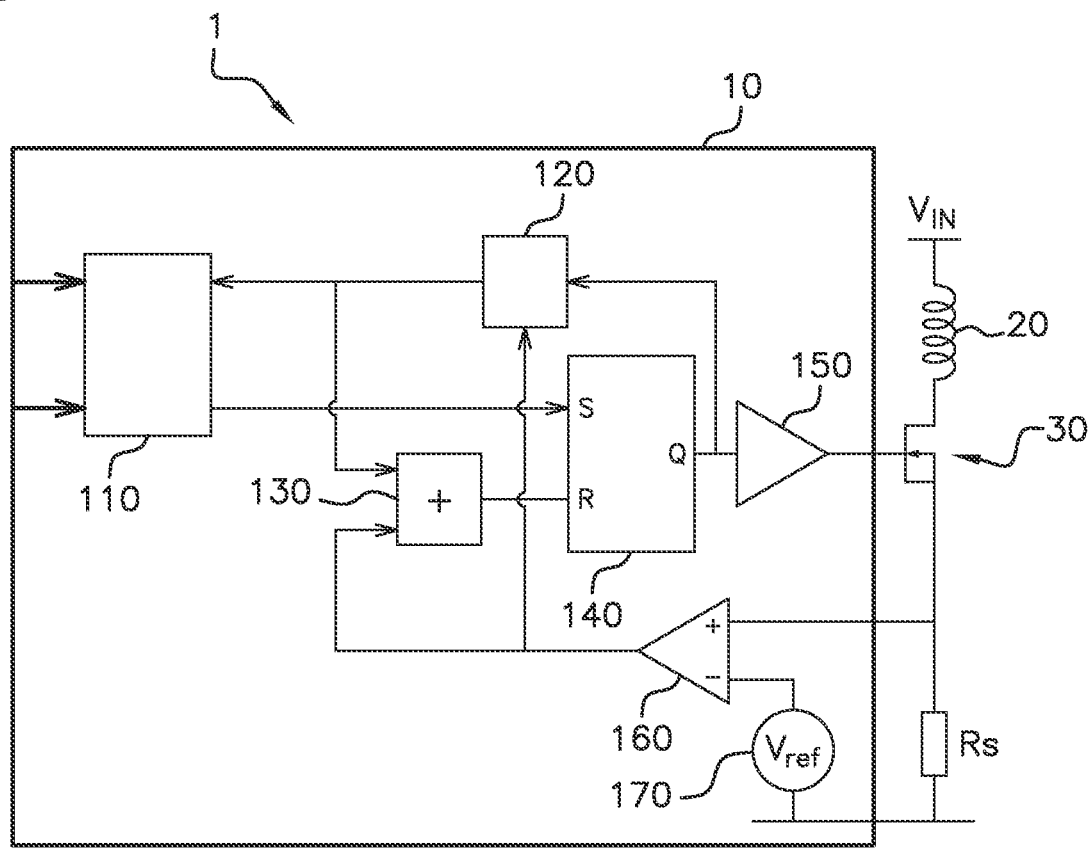
FIG. 2 illustrates a partial view of the converter of FIG. 1, in which view an exemplary control module is detailed.

FIG. 2 illustrates an exemplary control module 10 allowing these functions to be performed. In this example, the control module 10 firstly comprises a logic unit 110, a counter 120, an OR logic gate 130 (OR/+), an SR-Q latch 140, a driver 150, a comparator 160 and a generator 117 that delivers a reference voltage Vref.

The logic unit 110 for example takes the form of an integrated circuit and allows a command for switching the transistor 30 to its on state to be sent via the input S and the output Q of the latch 140 and via the driver 150.

Figure 3:
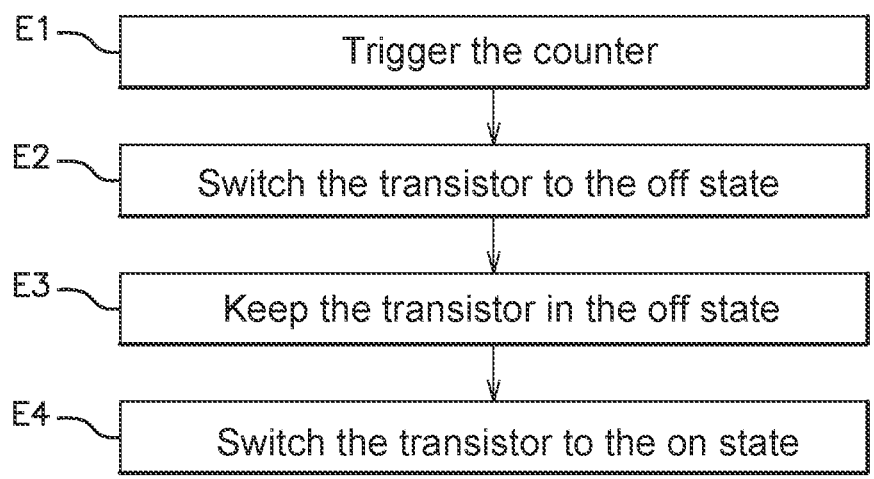
FIG. 3 illustrates one embodiment of the method according to the invention.

With reference to FIGS. 2 and 3, when it commands the passage of the transistor 30 from the off state to the on state, the logic unit 110 sends a control pulse to the input S of the latch 140 so that said latch 140 commands, via the driver 150, the gate G of the transistor 30 in order to get said transistor 30 to turn on.

In so doing, the output signal of the latch 140 is also sent to the counter 120 in order to trigger said counter 120 in a step E1. The time measurement taken by the counter 120 is sent to the logic gate 130 in order to simulate an achievement of the top current, and to the logic unit 110 which suspends the commands of the transistor 30 during the preset cooling time.

In parallel, the comparator 160 compares the voltage defined across the terminals of the shunt resistor Rs with the reference voltage Vref delivered by the generator 170 (for example 0.3 V) and resets to zero the counter 120 when the voltage defined across the terminals of the shunt resistor Rs becomes equal to the reference voltage Vref.

If the voltage defined across the terminals of the shunt resistor Rs becomes equal to the reference voltage Vref before the time measurement taken by the counter 120 reaches the preset observation time, the comparator 160 generates an output signal that, on the one hand, resets the counter 120 to zero and, on the other hand, commands stoppage of the transistor 30 via, in succession, the logic gate 130, the input R of the latch 140 and the driver 150.

In contrast, if the time measurement taken by the counter 120 reaches the preset observation time while the voltage defined across the terminals of the shunt resistor Rs has not equaled the reference voltage Vref, this means that the amplitude of the peak current Ipeak has not reached its top value because the input voltage Vin of the converter 1 (i.e. the voltage delivered by the supply battery of the vehicle) is too low.

In this case, the counter 120 commands, in a step E2, the transistor 30, via the logic gate 130, the latch 140 and the driver 150, in order to get said transistor 30 to switch from the on state to the off state. The counter 120 also commands the logic unit 110 in order to get the latter to suspend the command of the transistor 30 for the provided cooling time.

Next, the logic unit 110 keeps, in a step E3, the transistor 30 in the off state for the preset cooling time, for example for 1000 microseconds, in order to leave the electronic components of the converter 1 the time to cool, thus decreasing the losses and a decrease in the efficiency of the converter 1.

Lastly, when the cooling time has passed, the logic unit 110 again commands, in a step E4, the transistor 30 to its on state in order to get it once again to convert the input voltage Vin into the output voltage Vout, thus allowing the intermediate capacitor Cint to be recharged.

The method according to the invention thus allows the operation of the converter 1 to be suspended in order to limit overheating thereof, and to leave it to cool for a given time, when the peak current Ipeak has not reached its top value sufficiently rapidly.

The invention claimed is:

1. A method for controlling a DC-DC voltage converter (1) for driving with current at least one fuel injector (2) of a motor-vehicle internal combustion engine, said DC-DC voltage converter (1) comprising a control module (10) and an induction coil (20) that is connected to a field-effect transistor (30) comprising a drain (D), a source (S) and a gate (G), said gate (G) being connected to the control module (10) in order for said control module (10) to command the field-effect transistor (30) to an on state in which current passes between the drain (D) and the source (S) or to an off state in which current does not pass between the drain (D) and the source (S), the alternation of the on and the off states of the field-effect transistor (30) generating a sawtooth current called a peak current (Ipeak), the amplitude of which is bounded by a maximum value, called a "top" value, and that allows the DC-DC voltage converter (1) to deliver an output voltage (Vout) across the terminals of a capacitor called an "intermediate" capacitor (Cint), a discharge of which is commanded by a computer via a drive module in order to command the at least one fuel injector (2), the DC-DC voltage converter (1) being configured to make said output voltage (Vout) tend toward a target value, the method comprising:

when the field-effect transistor (30) is switched from the off state to the on state, triggering (E1) a counter (120) for measuring time, if at the end of a preset time called an "observation" time, the amplitude of the peak current (Ipeak) has not reached the maximum value, commanding (E2) the field-effect transistor (30) so that said field-effect transistor (30) switches from the on state to the off state, keeping (E3) the field-effect transistor (30) in the off state for a preset time called a "cooling" time, commanding (E4) the field-effect transistor (30) so that said field-effect transistor (30) switches to the on state at the end of the cooling time.

2. The method as claimed in claim 1, wherein the observation time is comprised between 50 and 100 microseconds.

3. The method as claimed in claim 2, wherein the cooling time is comprised between 0 and 2000 microseconds.

4. The method as claimed in claim 1, wherein the cooling time is comprised between 0 and 2000 microseconds.

5. A DC-DC voltage converter (1) for driving with current at least one fuel injector (2) of a motor-vehicle internal combustion engine, said DC-DC voltage converter (1) comprising a control module (10) and an induction coil (20) that is connected to a field-effect transistor (30) comprising a drain (D), a source (S) and a gate (G), said gate (G) being connected to the control module (10) in order for said control module (10) to command the field-effect transistor (30) to an on state in which current passes between the drain (D) and the source (S) or to an off state in which current does not pass between the drain (D) and the source (S), the alternation of the on and the off states of the field-effect transistor (30) generating a sawtooth current called [[the]]a peak current (Ipeak), the amplitude of which is bounded by a maximum value, called a "top" value, and that allows the DC-DC voltage converter (1) to deliver an output voltage (Vout) across the terminals of a capacitor called an "intermediate" capacitor (Cint), the discharge of which is commanded by a computer via a drive module in order to command the at least one fuel injector (2), the DC-DC voltage converter (1) being configured to make said output voltage (Vout) tend toward a target value, wherein the control module (10) is configured to:

switch the field-effect transistor (30) from the off state to the on state, trigger a counter (120) for measuring time when the field-effect transistor (30) is switched to the on state, if at the end of a preset time called an "observation" time, the amplitude of the peak current (Ipeak) has not reached the maximum value, command the field-effect transistor (30) so that said field-effect transistor (30) switches from the on state to the off state, keep the field-effect transistor (30) in the off state for a preset time called a "cooling" time, command the field-effect transistor (30) so that said field-effect transistor (30) switches to the on state at the end of the cooling time.

6. The DC-DC voltage converter (1) as claimed in claim 5, wherein the control module (10) comprises the counter (120) for measuring the time taken for the peak current to reach or not the top value.

7. The DC-DC voltage converter (1) as claimed in claim 6, wherein the control module (10) comprises a comparator (160) of the voltage defined across the terminals of a current-measuring shunt connected between the source (S) of the field-effect transistor (30) and ground (M), and of a reference voltage (Vref) representing the top value of the peak current (Ipeak).

8. The DC-DC voltage converter (1) as claimed in claim 6, wherein the control module (10) comprises a logic unit (110) configured to send signals for commanding the gate (G) of the field-effect transistor (30) in order to get said field-effect transistor (30) to switch to the on state.

9. A motor vehicle comprising the DC-DC voltage converter (1) as claimed in claim 6.

10. The DC-DC voltage converter (1) as claimed in claim 5, wherein the control module (10) comprises a comparator (160) of the voltage defined across the terminals of a current-measuring shunt connected between the source (S) of the field-effect transistor (30) and ground (M), and of a reference voltage (Vref) representing the top value of the peak current (Ipeak).

11. The DC-DC voltage converter (1) as claimed in claim 10, wherein the control module (10) comprises an OR logic gate (130) a first input of which is connected to the output of the counter (120) and a second input of which is connected to the output of the comparator (160).

12. The DC-DC voltage converter (1) as claimed in claim 11, wherein the control module (10) comprises a logic unit (110) configured to send signals for commanding the gate (G) of the field-effect transistor (30) in order to get said field-effect transistor (30) to switch to the on state.

13. A motor vehicle comprising the DC-DC voltage converter (1) as claimed in claim 11.

14. The DC-DC voltage converter (1) as claimed in claim 10, wherein the control module (10) comprises a logic unit (110) configured to send signals for commanding the gate (G) of the field-effect transistor (30) in order to get said field-effect transistor (30) to switch to the on state.

15. A motor vehicle comprising the DC-DC voltage converter (1) as claimed in claim 10.

16. The DC-DC voltage converter (1) as claimed in claim 5, wherein the control module (10) comprises a logic unit (110) configured to send signals for commanding the gate (G) of the field-effect transistor (30) in order to get said field-effect transistor (30) to switch to the on state.

17. The DC-DC voltage converter (1) as claimed in claim 16, wherein the control module (10) comprises a latch (140) that receives, on a first input, the control signals sent by the logic unit (110) in order to switch the field-effect transistor (30) to the on state and, on a second input, the output of the logic gate (130) in order to switch the field-effect transistor (30) to the off state.

18. A motor vehicle comprising the DC-DC voltage converter (1) as claimed in claim 17.

19. A motor vehicle comprising the DC-DC voltage converter (1) as claimed in claim 16.

20. A motor vehicle comprising the DC-DC voltage converter (1) as claimed in claim 5.

* * * * *